United States Patent
Watanabe et al.

(10) Patent No.: US 7,402,830 B2
(45) Date of Patent: Jul. 22, 2008

(54) GALLIUM NITRIDE-BASED COMPOUND SEMICONDUCTOR LIGHT-EMITTING DEVICE

(75) Inventors: Munetaka Watanabe, Ichihara (JP); Noritaka Muraki, Ichihara (JP); Yasushi Ohno, Ichihara (JP)

(73) Assignee: Show a Denko K.K., Tokyo (JP)

( * ) Notice: Subject to any disclaimer, the term of this patent is extended or adjusted under 35 U.S.C. 154(b) by 0 days.

(21) Appl. No.: 10/592,759

(22) PCT Filed: Mar. 15, 2005

(86) PCT No.: PCT/JP2005/005044

§ 371 (c)(1),
(2), (4) Date: Sep. 14, 2006

(87) PCT Pub. No.: WO2005/088740

PCT Pub. Date: Sep. 22, 2005

(65) Prior Publication Data

US 2007/0187666 A1 Aug. 16, 2007

Related U.S. Application Data

(60) Provisional application No. 60/555,414, filed on Mar. 23, 2004.

(30) Foreign Application Priority Data

Mar. 16, 2004 (JP) .............................. 2004-074932

(51) Int. Cl.
*H01L 29/06* (2006.01)
(52) U.S. Cl. ...................................... 257/13
(58) Field of Classification Search .................. 257/13, 257/21, 59, 79, 72, 103, 99, E33.005; 438/22, 438/46
See application file for complete search history.

(56) References Cited

U.S. PATENT DOCUMENTS

| 7,056,755 | B1 * | 6/2006 | Kamei et al. | 438/45 |
| 2001/0042860 | A1 * | 11/2001 | Hata et al. | 257/21 |
| 2002/0053676 | A1 | 5/2002 | Kozaki | |
| 2003/0205736 | A1 | 11/2003 | Kozaki | |

FOREIGN PATENT DOCUMENTS

JP 2002-84038 A 3/2002

OTHER PUBLICATIONS

A. Adesida, et al, "Reactive Ion Etching of Gallium Nitride in Silicon Tetrachloride Plasms[a]", Apply. Phys. Lett., vol. 63, No. 20, 1993, pp. 2777-2779.

* cited by examiner

*Primary Examiner*—Nathan W Ha
(74) *Attorney, Agent, or Firm*—Sughrue Mion, PLLC

(57) ABSTRACT

The inventive gallium nitride compound semiconductor light-emitting device comprises a substrate; an n-type semiconductor layer, a light-emitting layer, a p-type semiconductor layer, the layers being successively provided atop the substrate and being formed of a gallium nitride compound semiconductor; a negative electrode provided on the n-type semiconductor layer at a certain portion thereof, the portion being exposed by partial, depthwise removal of the light-emitting layer and the p-type semiconductor layer altogether through reactive ion etching; and a positive electrode provided on the remaining p-type semiconductor layer, wherein the gallium nitride compound semiconductor light-emitting device is produced through reactive ion etching by use of silicon tetrachloride as the sole etching gas.

6 Claims, 2 Drawing Sheets

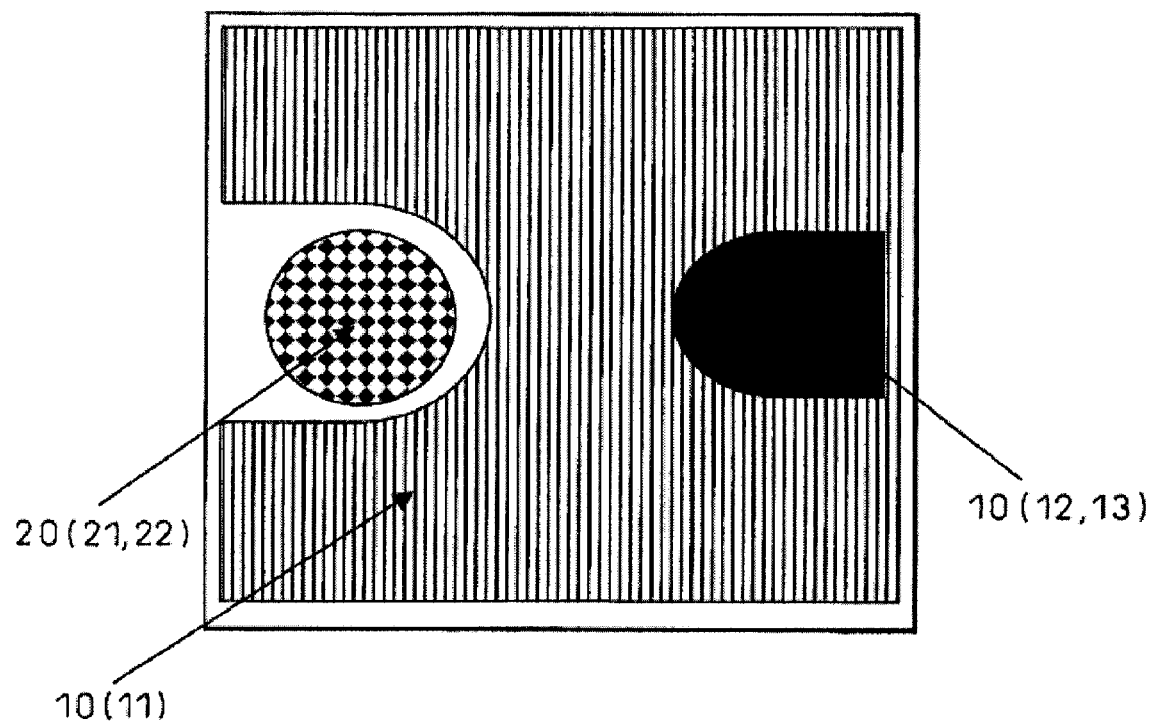

GALLIUM NITRIDE-BASED COMPOUND SEMICONDUCTOR LIGHT-EMITTING DEVICE

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/555,414 filed on Mar. 23, 2004, pursuant to 35 U.S.C. §111(b).

TECHNICAL FIELD

The present invention relates to a gallium nitride compound semiconductor light-emitting device and, more particularly, to a gallium nitride compound semiconductor light-emitting device that reliably exhibits excellent characteristics under high-temperature conditions.

BACKGROUND ART

In recent years, gallium nitride compound semiconductors represented by the formula $Al_xIn_yGa_{1-x-y}N$ ($0 \leq x < 1$, $0 \leq y < 1$, $x+y<1$) have become of interest as materials for producing a light-emitting diode (LED) which emits ultraviolet to blue light, or green light. Through employment of such a compound semiconductor, ultraviolet light, blue light, or green light of high emission intensity can be obtained; such high-intensity light has conventionally been difficult to attain. Unlike the case of a GaAs light-emitting device, such a gallium nitride compound semiconductor is generally grown on a sapphire substrate (i.e., an insulating substrate); hence, an electrode cannot be provided on the back surface of the substrate. Therefore, both a negative electrode and a positive electrode must be provided on semiconductor layers formed through crystal growth on the substrate.

In the case of the gallium nitride compound semiconductor device, the sapphire substrate is transparent with respect to emitted light. Therefore, attention has been paid to a flip-chip-type light-emitting device, which is configured by mounting the semiconductor device on a lead frame such that the electrodes face the lead frame, whereby emitted light is extracted through the sapphire substrate.

FIG. 1 is a schematic representation showing a general structure of a flip-chip-type light-emitting device. Specifically, the light-emitting device includes a substrate 1, a buffer layer 2, an n-type semiconductor layer 3, a light-emitting layer 4, and a p-type semiconductor layer 5, the layers being formed atop the substrate through crystal growth. A portion of the light-emitting layer 4 and a portion of the p-type semiconductor layer 5 are removed through etching, thereby exposing a portion of the n-type semiconductor layer 3 to the outside. A positive electrode 10 is formed on the p-type semiconductor layer 5, and a negative electrode 20 is formed on the exposed portion of the n-type semiconductor layer 3. The light-emitting device is mounted on, for example, a lead frame such that the electrodes face the frame, followed by bonding.

During mounting of a flip-chip-type light-emitting device, the device is heated to some hundreds of degrees Celsius. Therefore, the flip-chip-type light-emitting device is required to resist deterioration in characteristics and exhibit consistent characteristics at a temperature of some hundreds of degrees Celsius.

In the gallium nitride compound semiconductor light-emitting device, a portion of a gallium nitride compound semiconductor layer must be removed through etching for forming the aforementioned negative electrode. Reactive ion etching employing reactive gaseous plasma is a known technique for etching gallium nitride compound semiconductors, and has conventionally reported in a number of documents.

A large variety of etching gases such as $Cl_2$, a $Cl_2/H_2$ mixture gas, $CF_4$, $CCl_2F_2$, $CCl_4$, $BCl_3$, a $BCl_3/Ar$ mixture gas, a $BCl_3/SiCl_4$ mixture gas, $SiCl_4$, and an $SiCl_4/SiF_4$ mixture gas have been studied in terms of etching rate, etching residues produced, and other characteristics. Japanese Patent No. 2599250 and Japanese Laid-Open Patent Application (kokai) No. 8-293489 disclose that a $Cl_2/SiCl_4$ mixture gas is preferred from the viewpoint of etching rate and etching residue characteristics.

However, these etching gases have not been studied from the viewpoint of reliability in characteristics of the produced gallium nitride compound semiconductor light-emitting devices under high-temperature conditions.

DISCLOSURE OF INVENTION

When a gallium nitride compound semiconductor light-emitting device is produced through a known method including etching of a gallium nitride compound semiconductor by use of a $Cl_2/SiCl_4$ mixture gas, which has been conventionally known to be a preferred etching gas, the contact feature of the negative electrode with respect to an n-type semiconductor layer is changed from Ohmic contact to Schottky contact under relatively mild heating conditions, thereby increasing the forward voltage (VF).

Thus, an object of the present invention is to provide a gallium nitride compound semiconductor light-emitting device having excellent heat resistance, which device is resistive to an increase in forward operation voltage (VF) caused by mild heating performed after formation of the light-emitting device (e.g., heating at about 300° C. during mounting of the light-emitting device).

The present invention provides the following.

(1) A gallium nitride compound semiconductor light-emitting device comprising a substrate; an n-type semiconductor layer, a light-emitting layer, a p-type semiconductor layer, the layers being successively provided atop the substrate and being formed of a gallium nitride compound semiconductor; a negative electrode provided on the n-type semiconductor layer at a certain portion thereof, the portion being exposed by partial, depthwise removal of the light-emitting layer and the p-type semiconductor layer altogether through reactive ion etching; and a positive electrode provided on the remaining p-type semiconductor layer, wherein the gallium nitride compound semiconductor light-emitting device is produced through reactive ion etching by use of silicon tetrachloride as a sole etching gas.

(2) A gallium nitride compound semiconductor light-emitting device according to (1) above, wherein reactive ion etching is performed at an etching rate of 5 nm/min to 100 nm/min.

(3) A gallium nitride compound semiconductor light-emitting device according to (2) above, wherein reactive ion etching is performed at an etching rate of 15 nm/min or more.

(4) A gallium nitride compound semiconductor light-emitting device according to (2) or (3) above, wherein reactive ion etching is performed at an etching rate of 25 nm/min or less.

(5) A gallium nitride compound semiconductor light-emitting device according to any one of (1) to (4) above, wherein a layer constituting the negative electrode which is in contact with the n-type semiconductor layer contains Ti and/or Cr.

(6) A gallium nitride compound semiconductor light-emitting device according to any one of (1) to (5) above, wherein the light-emitting device is of a flip-chip type.

As the gallium nitride compound semiconductor light-emitting device of the present invention has excellent heat resistance, the heating conditions such as heating temperature and heating time, during a step of mounting a light-emitting device, particularly a flip-chip-mounting step, under which the device is treated can be relaxed. In addition, by virtue of high heat resistance, reliability and service life of the device can be improved.

BRIEF DESCRIPTION OF THE DRAWINGS

FIG. 3 a plan view showing a gallium nitride compound semiconductor light-emitting device fabricated in Example 1.

BEST MODES FOR CARRYING OUT THE INVENTION

Figure 1:
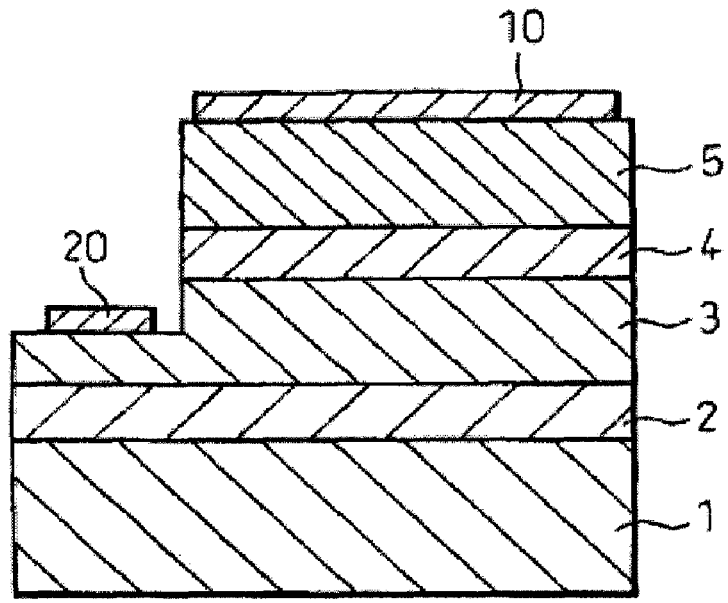
FIG. 1 is a schematic view showing a general structure of a conventional flip-chip-type compound semiconductor light-emitting device.

In the present invention, no particular limitation is imposed on the gallium nitride compound semiconductor layers stacked on a substrate, and the semiconductor stacked layers may have a conventionally known structure as shown in FIG. 1; i.e., a stacked structure comprising a buffer layer 2, an n-type semiconductor layer 3, a light-emitting layer 4, and a p-type semiconductor layer 5, the layers being formed atop a substrate 1 through crystal growth.

No particular limitation is imposed on the material of the substrate, and the substrate may be formed of any known material. Examples of the known material include oxide single crystals such as sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; SiC single crystal; GaAs single crystal; AlN single crystal; GaN single crystal; and boride single crystals such as $ZrB_2$ single crystal. No particular limitation is imposed on the crystal plane orientation of the substrate. The substrate may be an on-axis substrate or a substrate having an off-angle.

No particular limitation is imposed on the structure of the n-type semiconductor layer, the light-emitting layer, and the p-type semiconductor layer, and these layer may have a variety of known structures. Gallium nitride compound semiconductors represented by formula: $Al_xIn_yGa_{1-x-y}N$ ($0 \leq x < 1$, $0 \leq y < 1$, $0 \leq x+y < 1$) are known to form these layers. In the present invention, no particular limitation is imposed on the type of the gallium nitride compound semiconductor for forming the n-type semiconductor layer, the light-emitting layer, and the p-type semiconductor layer, and conventionally known gallium nitride compound semiconductors represented by formula: $Al_xIn_yGa_{1-x-y}N$ ($0 \leq x < 1$, $0 \leq y < 1$, $0 \leq x+y < 1$) may be employed.

No particular limitation is imposed on the method for growing these gallium nitride semiconductors, and there may be employed any known method for growing a Group III nitride semiconductor, such as MOCVD (metal-organic chemical vapor deposition), HVPE (hydride vapor phase epitaxy), or MBE (molecular beam epitaxy). From the viewpoints of layer thickness controllability and mass productivity, MOCVD is preferably employed. In the case of MOCVD, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, monosilane ($SiH_4$) or disilane ($Si_2H_6$) serving as an Si source, or germane ($GeH_4$) serving as a Ge source is employed as an n-type dopant, whereas bis (cyclopentadienyl)magnesium ($Cp_2Mg$) or bis (ethylcyclopentadienyl)magnesium (($EtCp)_2Mg$) serving as an Mg source is employed as a p-type dopant.

In order to attach a negative electrode to a gallium nitride compound semiconductor structure comprising a substrate and an n-type semiconductor layer, a light-emitting layer, and a p-type semiconductor layer, the layers being successively provided atop the substrate, such that the negative electrode is in contact with the n-type semiconductor layer, a portion of the light-emitting layer and a portion of the p-type semiconductor layer are removed so as to expose the n-type semiconductor layer.

One characteristic feature of the present invention is that the light-emitting layer and the p-type semiconductor layer are removed through reactive ion etching by use of $SiCl_4$ as a sole etching gas. Although the reason has not been completely elucidated, heat resistance of the fabricated gallium nitride compound semiconductor light-emitting device is improved through use of $SiCl_4$ as a sole etching gas, as compared with other etching gases.

In a specific procedure, an electrode is placed in an etching chamber having an internal pressure of generally about $10^{-4}$ Pa, and a gallium nitride compound semiconductor is placed on the electrode. $SiCl_4$ is fed into the etching chamber, and high-frequency voltage is applied to the electrode for generating plasma. The gallium nitride compound semiconductor is etched by the plasma.

During plasma etching, the internal pressure of the etching chamber may be controlled to, for example, 0.2 to 1 Pa, which is the same pressure as employed in typical reactive ion etching. The flow rate of $SiCl_4$ gas may be controlled to, for example, 10 to 50 sccm ($cm^3$/min as reduced to the normal state).

The etching rate is preferably 5 nm/min to 100 nm/min. When the etching rate is in excess of 100 nm/min, heat resistance of the fabricated gallium nitride compound semiconductor light-emitting device tends to be impaired. Thus, the etching rate is more preferably 60 nm/min or less, particularly preferably 40 nm/min or less, most preferably 25 nm/min or less. When the etching rate is less than 5 nm/min, productivity is poor. Thus, the etching rate is more preferably 10 nm/min or more, particularly preferably 15 nm/min or more.

The etching rate can be controlled by adjusting the power applied to the electrodes. Through appropriate control of upper electrode output (ICP output) and bias output, formation of columnar matter originating from etching residues on the etched surface can be prevented, and the etching rate can be controlled so as to fall within the above range. The upper electrode output (ICP output) and bias output may be optimized within a range of 50 to 300 W and a range of 0 to 300 W, respectively.

Any known reactive ion etching apparatus may be employed for etching. Examples of the etching apparatus include a reactive ion etching apparatus including an etching chamber, a high-frequency power source, an evacuation device, and a plasma source gas introduction apparatus.

No particular limitation is imposed on the composition and structure of the negative electrode, and any known negative electrodes may be employed. Examples of the contact material forming the layer that is in contact with the n-type semiconductor layer include Al, Ti, Nb, Au, Cr, W, V, Zr, Ta, Mo, and Tn. Of these, Ti and Cr are preferred, since these metals attain low-resistance ohmic contact. Needless to say, the negative electrode may have a multilayer structure including a bonding layer. The bonding layer may be formed from a material such as Au, Al, Ni, or Cu. Of these, Au is preferred.

No particular limitation is imposed on the composition and structure of the positive electrode, and any known positive electrodes may be employed. Examples of the light-permeable positive electrode material include Pt, Pd, Au, Cr, Ni, Cu, and Co. These material are known to exhibit enhanced light-permeability when the materials are partially oxidized. Examples of the reflecting positive electrode material include the aforementioned metal elements and Rh, Ag, and Al.

The aforementioned negative electrode and positive electrode may be formed through a known method such as sputtering or vacuum vapor deposition.

EXAMPLES

The present invention will next be described, in more detail, by way of examples, which should not be construed as limiting the invention thereto.

Example 1

Figure 2:
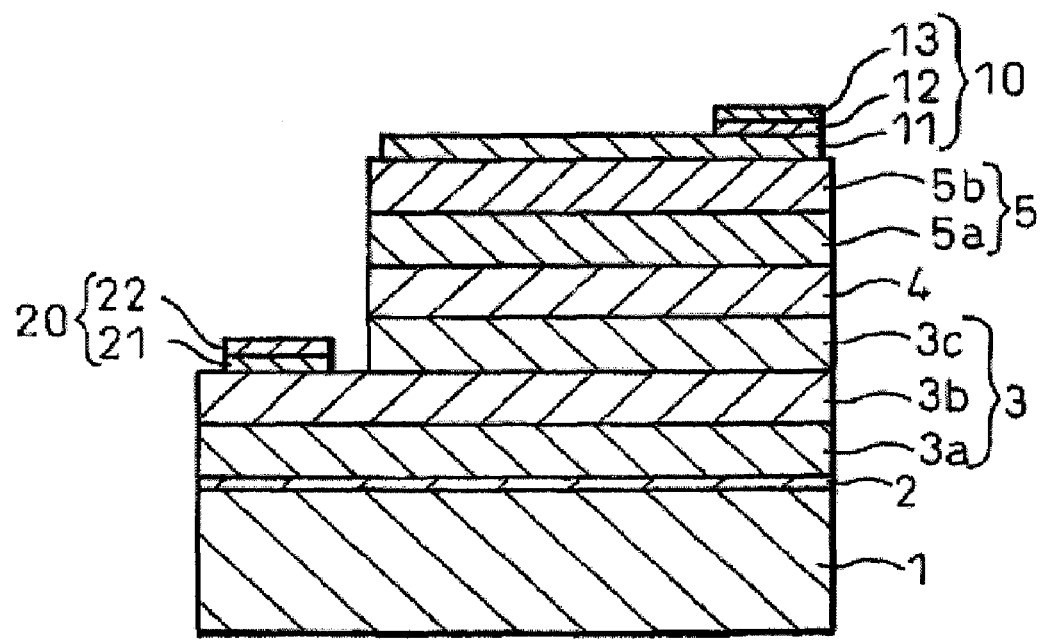
FIG. 2 a cross-sectional view showing a gallium nitride compound semiconductor light-emitting device fabricated in Example 1.

FIG. 2 shows a cross-section of the gallium nitride compound semiconductor light-emitting device fabricated in Example 1, and FIG. 3 shows a plan view thereof. A gallium nitride compound semiconductor stacked structure was fabricated by forming an AlN buffer layer (2) on a sapphire substrate (1), and on the buffer layer, the following layers were sequentially formed: an undoped GaN undercoat layer (thickness: 3 μm) (3a); an Si-doped n-type GaN contact layer (thickness: 2 μm) (3b); an n-type $In_{0.1}Ga_{0.9}N$ cladding layer (thickness: 0.03 μm) (3c); a light-emitting layer (4) of a multiple quantum well structure in which an Si-doped GaN barrier layer (thickness: 0.03 μm) and an $In_{0.20}Ga_{0.80}N$ well layer (thickness: 2.5 μm) were alternately laminated five times and finally the barrier layer was laminated; an Mg-doped p-type $Al_{0.07}Ga_{0.93}N$ cladding layer (thickness: 0.05 μm) (5a); and an Mg-doped p-type GaN contact layer (thickness: 0.15 μm) (5b). On the p-type GaN contact layer of the gallium nitride compound semiconductor stacked structure, appositive electrode (10) having a three-layer structure consisting of Rh (11)/Ti (12)/Au (13) was formed. On the n-type GaN contact layer, a negative electrode (20) having a double-layer structure consisting of Ti (21)/Au (22) was formed. The substrate side of the thus-fabricated light-emitting device serves as a light-extraction side. FIG. 3 shows the structures of the positive electrode and the negative electrode.

In the above stacked structure, the n-type GaN contact layer had a carrier concentration of $1 \times 10^{19}$ cm$^{-3}$, the GaN barrier layer had an Si dopant concentration of $1 \times 10^{18}$ cm$^{-3}$, the p-type GaN contact layer had a carrier concentration of $8 \times 10^{17}$ cm$^{-3}$, and the p-type AlGaN cladding layer had an Mg dopant concentration of $5 \times 10^{19}$ cm$^{-3}$.

These gallium nitride compound semiconductor layers were stacked through MOCVD under well known typical conditions. The positive electrode and the negative electrode were formed through the following procedure.

Through a known photolithography technique and lift-off technique, a first layer (Rh), a second layer (Ti), and a third layer (Au) were formed exclusively on an area of the p-type GaN contact layer for forming the positive electrode. At first, the three layers were formed by placing the gallium nitride compound semiconductor stacked structure in a sputtering apparatus, and on the p-type GaN contact layer, successively sputtering Rh (200 nm), Ti (5 nm), and Au (200 nm). After removal of the stacked structure from the vacuum chamber, a positive electrode having a structure shown in FIG. 3 was formed through a so-called known lift-off technique. Thus, a positive electrode consisting of a first layer (Rh), a second layer (Ti), and a third layer (Au) was formed on the p-type GaN contact layer.

The thus-fabricated positive electrode exhibited a reflectance of 60% (at 470 nm) at the interface between the electrode and the p-type GaN contact layer. The reflectance was measured by use of a test piece for reflectance measurement cut from the aforementioned positive electrode.

Subsequently, a portion of the n-type GaN contact layer on which the negative electrode was to be provided was exposed by means of reactive ion etching through the following procedure.

Firstly, an etching mask was formed on the positive electrode. The etching mask was formed through the following procedure. A photoresist was applied on the entire surface of the semiconductor stacked structure and a portion of the resist, which portion was slightly wider than the positive electrode, was removed through a known photolithographic technique. The thus-treated stacked structure was placed in a vacuum vapor deposition apparatus, and Ni (thickness: about 50 nm) and Ti (thickness: about 300 nm) were stacked through the electron-beam method at $4 \times 10^{-4}$ Pa or lower. Subsequently, the stacked metal film along with the resist was removed from the area other than the positive electrode area through lift-off technique. The etching mask was a layer provided in order to protect the positive electrode from damage caused by plasma involved in reactive ion etching.

On an electrode set in an etching chamber of the reactive ion etching apparatus, the semiconductor stacked structure was placed. The etching chamber was evacuated to $10^{-4}$ Pa, and etching gas ($SiCl_4$) was fed to the evacuated chamber. Etching was performed until the n-type GaN contact layer (3b) was exposed. After completion of etching, the structure was removed from the reactive ion etching apparatus, and the etching mask was removed with nitric acid and hydrofluoric acid.

The etching was performed under the following conditions: a flow rate of $SiCl_4$ of 30 sccm, an internal pressure of the etching chamber of 0.5 Pa, and output between electrodes of 120 W (upper electrode (ICP)) and 30 W (bias). Through employment of the etching conditions, formation of columnar matter originating from etching residues on the etched surface was prevented, and an etching rate of about 25 nm/min was attained.

On the thus-exposed n-type GaN contact layer, the negative electrode was formed through the following procedure. Firstly, a resist was applied to the entire surface of the structure, and a portion of the resist, which portion was an area for forming the negative electrode on the exposed n-type GaN contact layer, was removed through a known photolithographic technique. Through conventionally employed vacuum vapor deposition, Ti (100 nm) and Au (200 nm) were sequentially deposited on the semiconductor layer, to thereby form a negative electrode. Thereafter, the resist was removed through a routine method.

The back of the substrate of the thus-formed wafer having the positive electrode and the negative electrode was ground and polished, to thereby adjust the substrate thickness to 80 μm, followed by scribing the wafer on the semiconductor-stacked layer side by use of a laser scriber, and cutting through the chip-division lines, to thereby produce square chips (350 μm×350 μm). The forward voltage of respective chips at an applied current of 20 mA was found to be 2.9 V through measurement by means of a probe.

The chip was mounted on a sub-mount made of a silicon substrate in a flip-chip manner, and the thus-formed element was mounted in a TO-18 package can. The forward voltage of the element at an applied current of 20 mA was found to be 2.9 V through measurement by means of a tester, indicating that the forward voltage before mounting was unchanged. During mounting the chip on the sub-mount, the temperature of the chip was as high as 300° C.

Example 2

The procedure of Example 1 was repeated, except that the negative electrode was formed so as to have a stacked structure of Cr (on the semiconductor side, 100 nm) and Au (200 nm), to thereby fabricate a gallium nitride compound semiconductor light-emitting device.

The thus-produced light-emitting device was evaluated in a manner similar to that of Example 1, and the forward voltage was found to be 2.9 V before and after mounting.

Comparative Example 1

The procedure of Example 1 was repeated, except that $Cl_2$ gas was employed as an etching gas, to thereby fabricate a gallium nitride compound semiconductor light-emitting device.

The thus-produced light-emitting device was evaluated in a manner similar to that of Example 1. The forward voltage was found to be 2.9 V before mounting and be increased to 3.3 V after mounting.

In order to confirm the cause of elevation in forward voltage, a TLM electrode was formed on the n-type GaN contact layer in a manner similar to that employed in Example 1 or Comparative Example 1. The thus-produced structures were subjected to a 300° C.-heating test. The structure of the Example exhibited no change in ohmic electrode characteristics before and after mounting, but the structure of the Comparative Example exhibited a Schottky contact after heating.

Comparative Example 2

The procedure of Example 1 was repeated, except that a mixture of $SiCl_4$ and $Cl_2$ ($SiCl_4$:$Cl_2$=5 sccm:25 sccm) was employed as an etching gas, to thereby fabricate a gallium nitride compound semiconductor light-emitting device.

The thus-produced light-emitting device was evaluated in a manner similar to that of Example 1. Similar to Comparative Example 1, the forward voltage was found to be 2.9 V before mounting and was increased to 3.3 V after mounting.

Example 3~5 and Comparative Example 3~14

The procedure of Example 1 was repeated, except that a bias was adjusted to maintain an etching rate of 20 nm/min, each of $SiCl_4$, $Cl_2$, a mixture of $SiCl_4$ and $Cl_2$ ($SiCl_4$:$Cl_2$=1:1), $CH_2Cl_2$, and a mixture of $CH_2Cl_2$ and $Cl_2$ ($CH_2Cl_2$:$Cl_2$=1:1) was employed as an etching gas, and each of Cr, Ti and Al was employed as a negative 10 electrode material in contact with an n-type contact layer, to thereby fabricate a gallium nitride compound semiconductor light-emitting device.

The obtained light-emitting device was heated in an RTA furnace in the atmosphere at 300° C. for 3 minutes, and a contact characteristic and a contact resistance were determined through the circular TLM method before and after heating. The results are shown in Table 1.

TABLE 1

| Etching Gas | Heating Test | Negative Electrode | | |
|---|---|---|---|---|
| | | Cr—Au | Ti—Au | Al—Au |
| $Cl_2$ | Before Test | $2.00 \times 10^{-4}$ | $2.50 \times 10^{-4}$ | $2.40 \times 10^{-4}$ |
| | After Test | Schottky | Schottky | Schottky |
| $SiCl_4$ | Before Test | $1.80 \times 10^{-4}$ | $2.00 \times 10^{-4}$ | $2.30 \times 10^{-4}$ |
| | After Test | $2.00 \times 10^{-4}$ | $3.50 \times 10^{-3}$ | Schottky |
| $SiCl_4 + Cl_2$ | Before Test | $2.00 \times 10^{-4}$ | $2.30 \times 10^{-4}$ | $2.20 \times 10^{-4}$ |
| | After Test | Schottky | Schottky | Schottky |
| $CH_2Cl_2$ | Before Test | $3.20 \times 10^{-4}$ | $4.10 \times 10^{-4}$ | $3.50 \times 10^{-4}$ |
| | After Test | Schottky | Schottky | Schottky |
| $CH_2Cl_2 + Cl_2$ | Before Test | $2.20 \times 10^{-4}$ | $3.10 \times 10^{-4}$ | $2.00 \times 10^{-4}$ |
| | After Test | Schottky | Schottky | Schottky | unit: $\Omega \cdot cm^2$

In case that any etching gas other than $SiCl^4$ was employed, as shown in Table 1, the contact characteristic was changed to a Schottky contact.

INDUSTRIAL APPLICABILITY

The gallium nitride compound semiconductor light-emitting device provided according to the present invention is useful as an element for fabricating a light-emitting diode, a lamp, and similar devices. By virtue of excellent heat resistance, the gallium nitride compound semiconductor light-emitting device is particularly suitable for a flip-chip-type light-emitting device.

The invention claimed is:

1. A gallium nitride compound semiconductor light-emitting device comprising a substrate; an n-type semiconductor layer, a light-emitting layer, a p-type semiconductor layer, the layers being successively provided atop the substrate and being formed of a gallium nitride compound semiconductor; a negative electrode provided on the n-type semiconductor layer at a certain portion thereof, the portion being exposed by partial, depthwise removal of the light-emitting layer and the p-type semiconductor layer altogether through reactive ion etching using silicon tetrachloride as a sole etching gas; and a positive electrode provided on the remaining p-type semiconductor layer, wherein the gallium nitride compound semiconductor light-emitting device does not substantially exhibit an increase in forward voltage when flip-chip mounted.

2. The gallium nitride compound semiconductor light-emitting device according to claim 1, wherein reactive ion etching is performed at an etching rate of 5 nm/mm to 100 nm/mm.

3. The gallium nitride compound semiconductor light-emitting device according to claim 2, wherein reactive ion etching is performed at an etching rate of 15 nm/mm or more.

4. The gallium nitride compound semiconductor light-emitting device according to claim 2, wherein reactive ion etching is performed at an etching rate of 25 nm/mm or less.

5. The gallium nitride compound semiconductor light-emitting device according to claim 1, wherein a layer constituting the negative electrode which is in contact with the n-type semiconductor layer contains Ti and/or Cr.

6. The gallium nitride compound semiconductor light-emitting device according to claim 1, wherein the n-type semiconductor layer is a n-type GaN layer, said reactive ion etching using silicon tetrachloride as sole etching gas is conducted until the n-type GaN layer is exposed, and the negative electrode in contact with the n-type GaN layer contains Ti and/or Cr.

* * * * *